US006787845B2

(12) United States Patent
Deleonibus

(10) Patent No.: US 6,787,845 B2
(45) Date of Patent: Sep. 7, 2004

(54) METAL SOURCE AND DRAIN MOS TRANSISTOR

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/239,262

(22) PCT Filed: Mar. 21, 2001

(86) PCT No.: PCT/FR01/00841
§ 371 (c)(1),
(2), (4) Date: Sep. 19, 2002

(87) PCT Pub. No.: WO01/71818
PCT Pub. Date: Sep. 27, 2001

(65) Prior Publication Data
US 2003/0042547 A1 Mar. 6, 2003

(30) Foreign Application Priority Data
Mar. 22, 2000 (FR) .............................. 00 03634

(51) Int. Cl.$^7$ .............................................. H01L 29/78
(52) U.S. Cl. ........................ 257/327; 257/346; 257/347
(58) Field of Search ................................ 257/327, 346, 257/347

(56) References Cited

U.S. PATENT DOCUMENTS

| | | | | |
|---|---|---|---|---|
| 5,341,028 A | * | 8/1994 | Yamaguchi et al. | ......... 257/344 |
| 5,698,869 A | * | 12/1997 | Yoshimi et al. | ............. 257/192 |
| 6,441,435 B1 | * | 8/2002 | Chan | .......................... 257/347 |
| 6,506,649 B2 | * | 1/2003 | Fung et al. | .................. 438/300 |

* cited by examiner

Primary Examiner—Allan R. Wilson
(74) Attorney, Agent, or Firm—Thelen Reid & Priest LLP

(57) ABSTRACT

MOS transistor comprising:
a channel region (120) made of a semiconducting material above which there is a grid structure, the grid structure comprising a grid (110) and insulating spacers (122) coating the sides of the grid,
regions called source and drain extension regions (116a, 118a) located on each side of the channel, in direct contact with the semiconducting material of the channel, and arranged essentially under the grid structure, the extension regions being made of a non-insulating material,
source and drain regions (146, 148) made of metal, in contact with source and drain extension regions respectively and extending partly under the grid structure.

Application to manufacturing of integrated circuits.

4 Claims, 12 Drawing Sheets

METAL SOURCE AND DRAIN MOS TRANSISTOR

DESCRIPTION

1. Technical Field

This invention relates to a MOS (Metal-Oxide-Semiconductor) type transistor with metallic source and drain, and manufacturing processes for such a transistor.

Its applications are in the microelectronics fields, particularly for manufacturing integrated circuits with or without complementary transistors.

In particular, the invention is intended for use in applications requiring large scale integration of components, low energy consumption or high operating frequency.

2. State of Prior Art

FIG. 1 shows a diagrammatic cross section of a conventional MOS transistor at the end of an integration process for this transistor. The manufacturing process is the same for transistors with an n channel and transistors with p channels, apart from the doping steps.

The transistor in FIG. 1 comprises a p type silicon substrate 2 if the transistor has an n channel.

Two zones 4 and 6 are formed at a distance from each other on this substrate 2.

These zones 4 and 6 are $n^+$ type diffused zones forming the transistor source and drain.

As can be seen in FIG. 1, zones 4 and 6 are prolonged by zones 8 and 10 respectively, that are $n^-$ type diffused zones (less doped than zones 4 and 6).

Zones 8 and 10 form extensions of the source and drain zones under the transistor grid which will be discussed later.

The transistor in FIG. 1 also comprises two zones 12 and 14 that extend above zones 4 and 6 and approximately at the same level as zones 8 and 10 respectively (which are facing each other and are separated from each other only by a thin interval p type silicon).

These zones 12 and 14 are made of a metallic silicide and are self-aligned with respect to the transistor grid and with respect to the field insulation zones of this transistor, which will be discussed later.

Zones 12 and 14 form the shunt-metallisation of the transistor source and drain.

There is an electrically insulating layer 18 made of silica above the p type silicon zone 16 separating zones 8 and 10 from each other, extending also above these zones 8 and 10 and forming the insulation for the transistor grid.

There is a layer 20 made of polycrystalline silicon above layer 18.

There is a layer 22 above this layer 20 that is made of a metallic silicide and forms a shunt-metallisation.

The transistor grid is formed from these layers 20 and 22.

Furthermore, two electrically insulating spacers 24 and 26, for example made of silica or silicon nitride, extend on each side of the stack formed by the layers 20 and 22, as far as the grid insulation 18.

The transistor shown in FIG. 1 is electrically isolated from other identical transistors (not shown), also formed on the substrate 2, due to LOCOS type field insulation zones 28 and 30.

The entire structure thus obtained is covered by an insulating layer 32 made of silica glass doped with phosphorus and boron.

Two openings pass through this layer 32 on each side and open up on zones 12 and 14 respectively.

These two openings are filled with a metal by chemical vapour phase deposition and form the source and drain contacts 34 and 36 respectively.

The transistor in FIG. 1 also comprises two metallic interconnection layers 38 and 40 that are located on the surface of layer 32 and extend contacts 34 and 36 respectively.

The grid contact is not shown in FIG. 1.

FIG. 2 is a diagrammatic cross sectional view through another conventional MOS transistor.

This is a MOS on SOI (Silicon On Insulator) transistor that is shown at the end of its integration process.

The transistor in FIG. 2 is different from the transistor in FIG. 1 due to the fact that the layers 4 and 6 in it are much thinner and that these layers 4 and 6 and the silicon zone 42 between these layers are supported on a buried silicon oxide layer 44 that is itself supported on a silicon substrate 46.

The MOS transistors described above have a number of limitations related to their electronic characteristics and their dimensions on the substrate.

One of the main limitations is due to the value of the channel access resistance. This is due mainly to the internal resistance of the source and drain regions, and also to the quality of the source-channel and drain-channel contacts.

The access resistance to the transistor channels forms a constraint that has a negative influence, particularly on the operating speed performances and the consumption of the circuits on which they are installed.

The access resistance may be reduced by increasing the doping concentration in the source and drain regions. However, if the concentration is too high, there may be electrical perforation problems and this may be harmful to the life of the transistors.

The access resistance may also be reduced by increasing the thickness of the channel and the source and drain regions. A difficulty also arises in this case in the sense that a greater thickness of these regions can cause perforation of the transistor and leakage currents between the source and the drain. A greater thickness of the source and drain regions also causes an increase in the parasite source/substrate and drain/substrate capacitances.

A shallow depth of the channel and of the source and drain regions improves the behaviour of the transistor but increases the access resistance.

Furthermore, the production of contacts such as contacts 34 and 36 that can be seen in FIGS. 1 and 2, depends on the alignment precision of the manufacturing tools used. This constraint tends to prevent large scale integration of transistors and a reduction in their size.

FIG. 3 shows another type of known MOS transistor.

This type of transistor comprises a grid structure 57 comparable to the grid structure in FIGS. 1 and 2, described above. This structure lies above a very thin channel 95 defined in a substrate 50.

A metallic source and drain 92, 94 can be seen on each side of the grid structure. The source and drain are self-aligned on the grid structure 57 and extend partly underneath it. The reference 58 denotes an etching and polishing stop layer separating the source from the drain.

Furthermore, the source and drain are separated from the substrate 50 by an insulating layer 84. Extensions 88 and 90 of the insulating layer join the grid insulating layer and separate the source and drain regions 92, 94 from the channel region 95, respectively.

The extensions 88 and 90 are sufficiently thin to enable the passage of charge carriers, by the tunnel effect, from the source to the drain, through the channel in order to encourage the Coulomb blocking phenomenon.

The metallic nature of the source and drain, and their partial extension under the grid structure, tend to reduce the access resistance below the values of the transistors in FIGS. 1 and 2.

Furthermore, the self-alignment of the source and drain on the grid structure improves the compactness of the transistor and facilitates its miniaturisation.

A more detailed description of a transistor conform with FIG. 3 is given in document (1), for which the references are given at the end of the description. Other documents illustrating prior art or the manufacturing technologies used are also referenced at the end of the description.

Presentation of the Invention

The purpose of the invention is to propose a MOS transistor with performances better than previously described transistors, and that does not depend on conduction by the tunnel effect.

Another purpose is to propose a particularly compact transistor of this type suitable for large scale integration for the manufacture of circuits.

Yet another purpose is to propose such a transistor that has a particularly low access resistance and that is particularly resistant to electrical perforation or leakage phenomena.

Another purpose of the invention is to propose process for manufacturing such a transistor.

More precisely, the purpose of the inventions is a MOS transistor comprising:
  a channel region made of semiconducting material above which there is a grid structure, the grid structure comprising a grid and insulating spacers coating the sides of the grid;
  regions, called the source and drain extension regions, located on each side of the channel in direct contact with the semiconducting material of the channel, and arranged essentially under the grid structure, the extension regions being made of a non-insulating material,
  metallic source and drain regions, in contact with the source and drain extension regions respectively, and extending partly under the grid structure.

The source and drain extension regions are made of a semiconducting or conducting material or an alloy or a compound of a semiconducting or conducting material, in other words, as described above, from a non-insulating material.

Furthermore, source and drain extension regions preferably extend at least partly under the grid, to optimise operation of the transistor.

Therefore, the transistor according to the invention is fundamentally different from the transistor in FIG. 3 and does not use the tunnel effect.

The transistor according to the invention operates like a device with a surface or buried inversion channel while the device in FIG. 3 is a quantum well MOS device using the Coulomb blocking effect, throughout the semiconducting volume under the grid.

The transistor according to the invention may be used as a voltage amplifying device.

The device in FIG. 3 may be used as a memory device or analogue electron counting device.

The transistor may also comprise an insulating layer designed to electrically isolate a solid part of a support substrate on which it is made. This is the case particularly when the transistor is made on an SOI (Silicon On Insulator) type substrate, in which the insulating layer is formed from a buried silicon oxide layer.

In particular, the insulating layer avoids parasite currents into the solid part of the substrate, and improves the electric isolation of the source and drain regions. It also limits their thickness.

According to another possibility, the transistor may comprise a discontinuous insulating layer, separating the assembly composed of the source and drain regions and the source and drain extension regions, from a solid part of the substrate. In this case, the channel may remain in electrical contact with the said solid part. The opening towards the subjacent solid substrate then enables parasite currents generated under the grid at the interface at the drain to escape.

Another purpose of the invention is a process for manufacturing a MOS transistor substrate, comprising:
  a channel region made of a semiconducting material above which there is a grid structure, the grid structure comprising a grid and insulating spacers coating the sides of the grid,
  regions called the source and drain extension regions made of a non-insulating material located on each side of the channel, in direct contact with the semiconducting material of the channel is made, and essentially extending under the grid structure,
  metallic source and drain regions, in contact with the source and drain extension regions respectively.

The process comprises at least one substrate etching step to define part of the transistor selected among firstly the channel region, and secondly the source and drain extension regions; the etching extending partly under the grid structure.

In a first particular embodiment of the process, the etching may be used to fix the length of the assembly formed by the channel and source and drain extension regions.

In this case, the length is considered along the source-drain direction.

In this case, the etching concerns mainly the extension regions.

The process according to the invention can then more precisely comprise the following steps:
  the formation of the grid on the semiconducting substrate, separated from the substrate by a grid insulation layer,
  the implantation of doping impurities in the substrate, with a first dose, using the grid as the implantation mask to form the first doped zones on each side of the grid;
  formation of insulating lateral spacers on the sides of the grid, covering part of the first doped zones, to form the grid structure;
  etching of the substrate to eliminate doped zones not protected by the grid structure and eliminate part of the first doped zones under the grid structure, a remaining part of the first doped zones kept during etching, forming the source and drain extension regions;
  formation of the source and drain, including the deposition of a metal that comes into contact with the source and drain extension regions respectively under the grid structure.

The etching may be done using any isotropic etching technique in order to eliminate part of the substrate under the grid structure.

However, this type of etching requires precise control over when it stops to avoid completely eliminating the semiconductor under the grid. More simply, this control is also necessary to not excessively attack the source and drain extension regions.

Furthermore, in order to enable more precise control of the etching, it would be possible to carry out a second doping at a dose rate higher than the dose rate in the first doping, using the grid structure as an implantation mask, after formation of the lateral spacers. This doping leads to the formation of second doped zones, extending on each side of the grid structure and partially under the grid structure. Selective etching of the second doped zones is then done, while preserving part of the first doped zones under the grid structure not affected by the second doping.

Selective etching in this case makes use of a difference in the etching rate between differently doped materials. Doping with a higher content will result in a semiconducting material that is more sensitive to the etching agents used.

The choice of etching agents and the implantation doses for the second doping are thus means of more precisely controlling the etching. It is also a means of controlling the size of the source and drain extension regions preserved during etching.

For example, the second doping may be a $p^+$ type doping by implantation of germanium and/or boron. It may also be done by implanting carbon.

Furthermore, the etching may be followed by the formation of a metal silicide layer on part of the source and drain extension regions. This layer is formed on the exposed parts of the etching.

It is also possible to form a bond layer outside the source and drain extension regions, either at the same time or not at the same time as the silicide is formed.

The bond layer may be a metallic layer, all or partly nitrided, with the function of guaranteeing good mechanical contact between the metal and the source and drain regions and the previously formed structure.

For example, a titanium nitride layer can give a better electrical contact between the metal in the source drain regions and the semiconducting part of the extension regions.

According to a second possible embodiment of the process according to the invention that forms a variant to the embodiment described above, the process may comprise:

the formation of a grid structure on a substrate comprising a grid and insulating lateral spacers coating the grid;

etching of part of the substrate on each side of the grid structure, and partially under the grid structure, preserving a region of the substrate under the grid, forming the channel region;

placement of material on the sides opposite the channel region to form the source and drain extension regions respectively;

formation of source and drain, including the deposition of a metal in contact with the source and drain extension regions.

Placement of a material on the sides of the channel may denote growth of the material, for example by epitaxy, or a simple deposition of material. Apart from placement of the material, formation of extension regions may include heat treatment. This aspect will be described in more detail in the rest of the text.

According to the second possible embodiment of the process described above, the etching does not fix the dimensions of the source and drain extension regions but simply fixes the width of the channel in the source-drain direction.

Thus, only the channel is made of the semiconducting material of the substrate that supports the transistor. Therefore, the extension regions formed by growth after etching may be made of a different material, chosen freely.

The source and drain extension regions may be made, for example, by growing a material selected from among Si, $SiGe_xC_y$, or a metal or metal oxide. When the material is a semiconductor, it may also be doped.

In particular, the source and drain extension regions can be formed by growing a doped material with exactly the same type of conductivity as the type of conductivity in the channel region, and with a greater concentration of doping impurities than the concentration of doping impurities in the channel region.

According to one variant, it is also possible to make the source and drain extension regions by the formation of metal silicide regions on the sides of the channel. The silicide regions that form the source and drain extension regions may, for example, be formed by the deposition of a metal and then by heat treatment to cause interdiffusion of metal with the silicon in the channel.

As in the first embodiment, the substrate can be etched selectively. In this case, before etching, impurities are implanted in the substrate in order to dope a layer of the substrate extending on each side of the grid structure and extending partially under the grid structure. Thus, all that is preserved from the doping is a region that will form the channel region. The implantation is followed by a selective etching to eliminate the layer of the substrate doped in this manner.

The additional formation of a contact layer (silicide) or a bond layer may also be envisaged as described above.

Other characteristics and advantages of the invention will become clearer after reading the following description with reference to the figures in the attached drawings. This description is given purely for illustrative purposes and is in no way restrictive.

DETAILED DESCRIPTION OF EMBODIMENTS OF THE INVENTION

Figure 1:
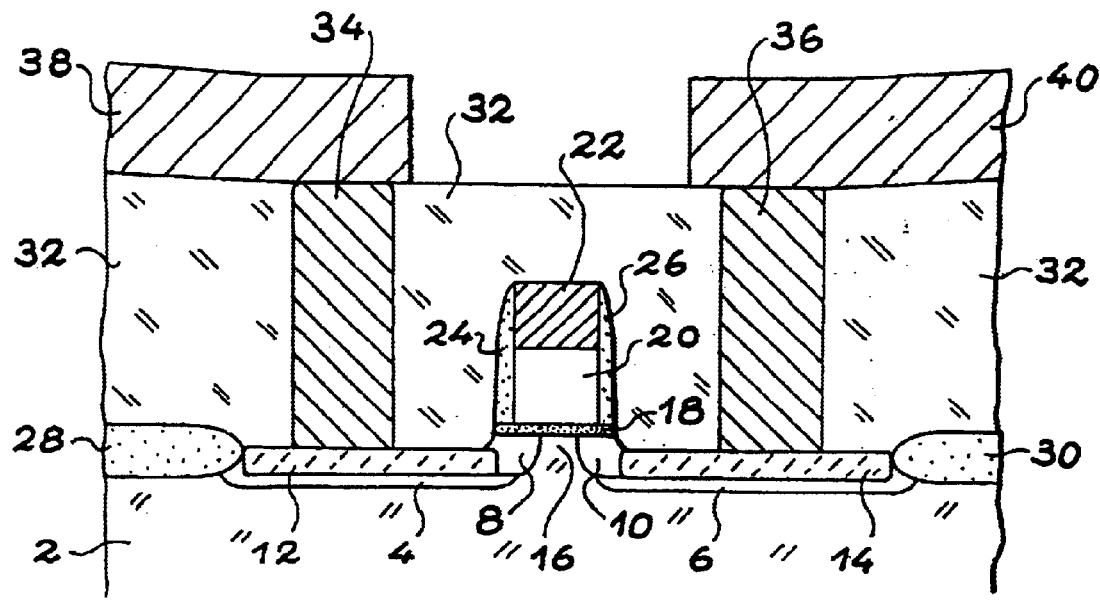
FIG. 1, already described, is a diagrammatic cross section through a known type of MOS transistor, formed on a solid semiconducting substrate.
Figure 2:
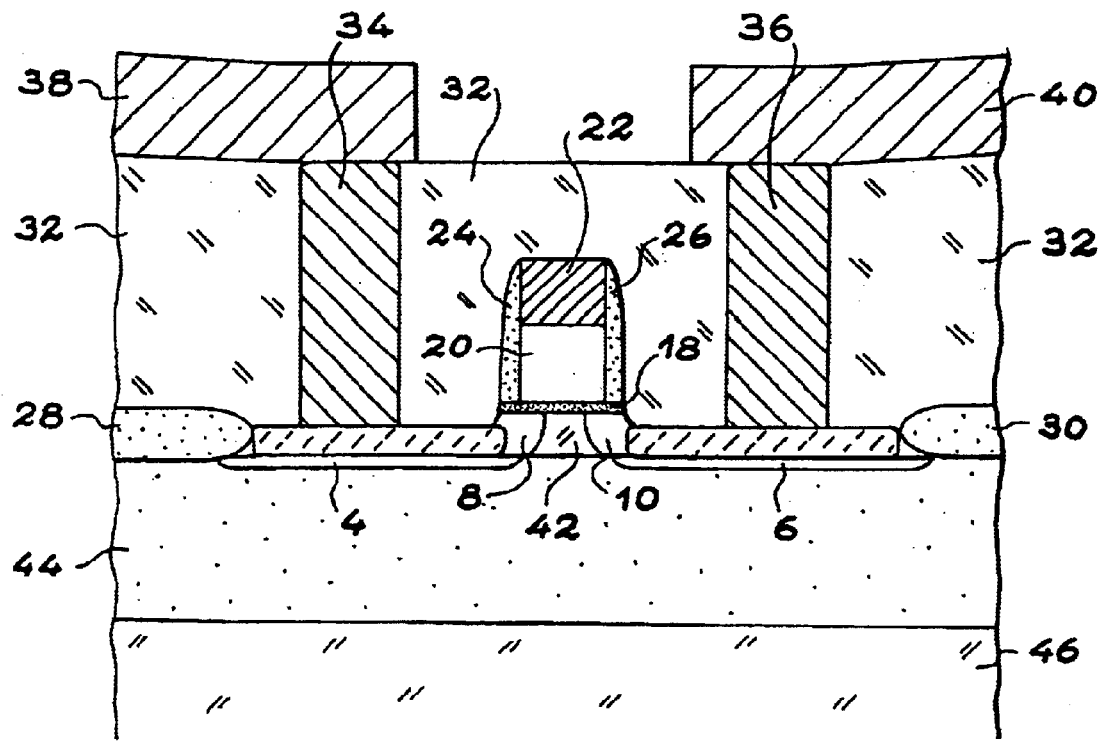
FIG. 2, already described, is a diagrammatic cross section of a MOS transistor similar to that in FIG. 1, formed on a silicon on insulator (SOI) type substrate.
Figure 3:
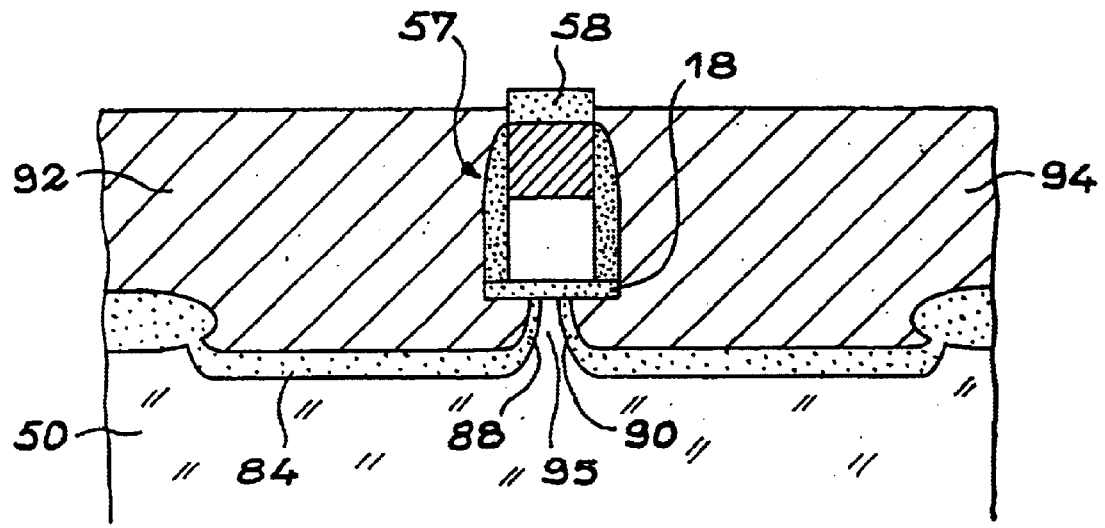
FIG. 3, already described, is a diagrammatic cross section of another known type of MOS transistor with a metallic source and drain.

In the following description, parts that are identical to, similar to or equivalent in the different figures are identified with the same references. However, these references are unrelated to the references in FIGS. 1 to 3 that have already been described in the introductory part.

A first part will describe and illustrate the manufacture of a MOS transistor on an SOI type substrate. However, the manufacturing steps are approximately the same on a solid substrate made of any semiconductor.

Figure 4:
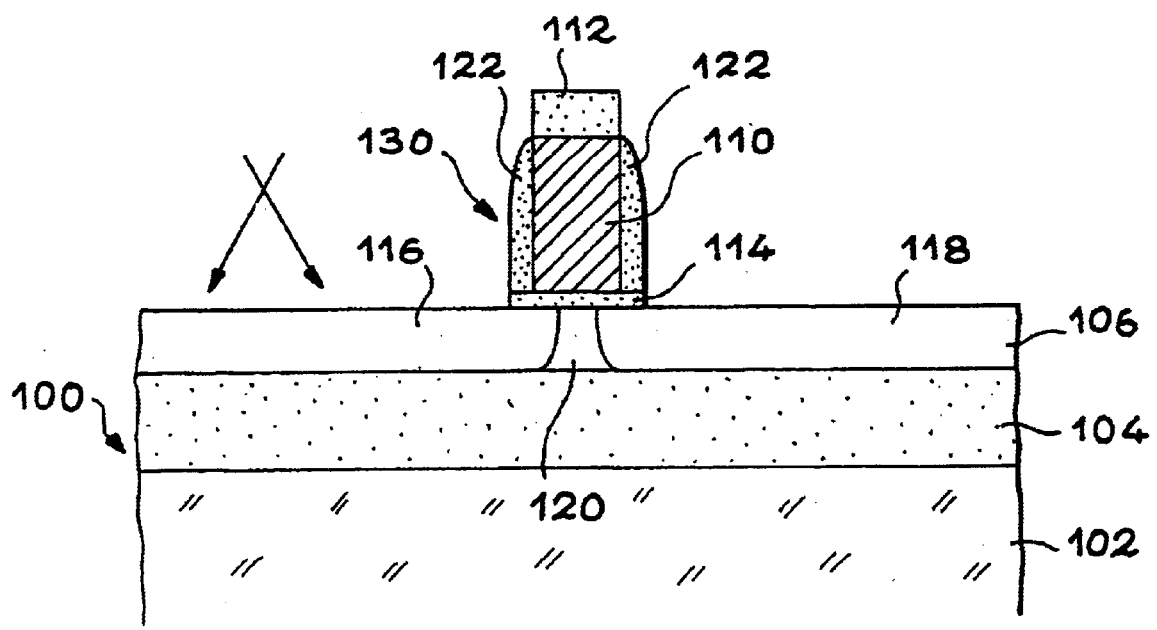
FIGS. 4 to 8 are diagrammatic cross sections of an SOI type substrate on which a transistor conform with the invention is made. They illustrate successive steps in a transistor manufacturing process.

The SOI substrate 100 comprises a solid silicon part 102, a buried and insulating layer 104 of silicon oxide, and a surface layer 106 of silicon, as shown in FIG. 4.

The surface layer 106 is a thin layer, for example with a thickness of between 5 and 1000 mm.

A first step in the process comprises the formation of a transistor grid 110 on the thin surface layer 106. This grid may be metallic, or in the case of the example described, made for example of polycrystalline silicon. There is a layer 112 made of an electrically insulating material such as silicon nitride, on top of the grid 110. The role of this layer will appear later in the description. Finally, there is a grid insulation layer 114, for example made of silicon oxide, under the grid.

The grid is manufactured using lithography processes well known in the microelectronics industry, and therefore is not described here.

A first implantation of doping impurities using the grid as the implantation mask, is used to form the doped regions 116, 118 on each side of the grid. These doped regions delimit a region of the channel 120 under the grid. The doped regions themselves are formed in the surface layer 106 and are delimited by the buried layer 104. The term "on each side of the grid" refers to one side of the grid facing the source and one side of the grid facing the drain. Furthermore, an expert in the subject will understand that elements formed on each side of the grid are mutually isolated from each other.

The selection of doping materials used to form the doped regions 116, 118 affects the type of conductivity of the source and drain extension regions. These regions are formed later.

In general, for a transistor with an n channel, impurities are implanted that lead to the formation of n type regions, p type regions are formed for a transistor with a p channel.

The concentration of impurities in doped regions 116, 118 is preferably greater than the concentration in the channel region 120.

The channel may be doped either by using a doped substrate initially, or by making a preliminary doping before the grid is formed.

For example, the concentration of impurities in the channel may be $10^{15}$ to $5.10^{18}$ at/cm$^3$ and the concentration of impurities in implanted regions 116, 118 may be of the order of $10^{18}$ to $10^{20}$ at/cm$^3$.

The concentration of doping impurities in regions 116, 118 may be uniform or gradual, increasing with the distance from the channel region.

The figure also shows that the interfaces of the doped regions 116, 118 with the channel 120 are not exactly vertically in line with the grid, but are slightly underneath the grid. This offset may be caused by a diffusion of doping impurities or, as shown by the arrows, by doing an implantation that is not perpendicular to the surface of the substrate.

After the implantation, insulating lateral spacers 122 are formed on the sides of the grid. For example, their formation includes the deposition of an insulating material such as silicon oxide or nitride, followed by anisotropic etching of this material. The spacers may be single or double (with two layers).

The assembly formed by the grid 110 and the spacers 122 is denoted by "grid structure" in the following, and is marked with reference 130. Before the grid is equipped with insulating spacers, the surface of the grid may be oxidised to consolidate the grid insulation (oxide) and to make it less sensitive to heat or chemical treatments accompanying the operational steps that follow.

Figure 5:
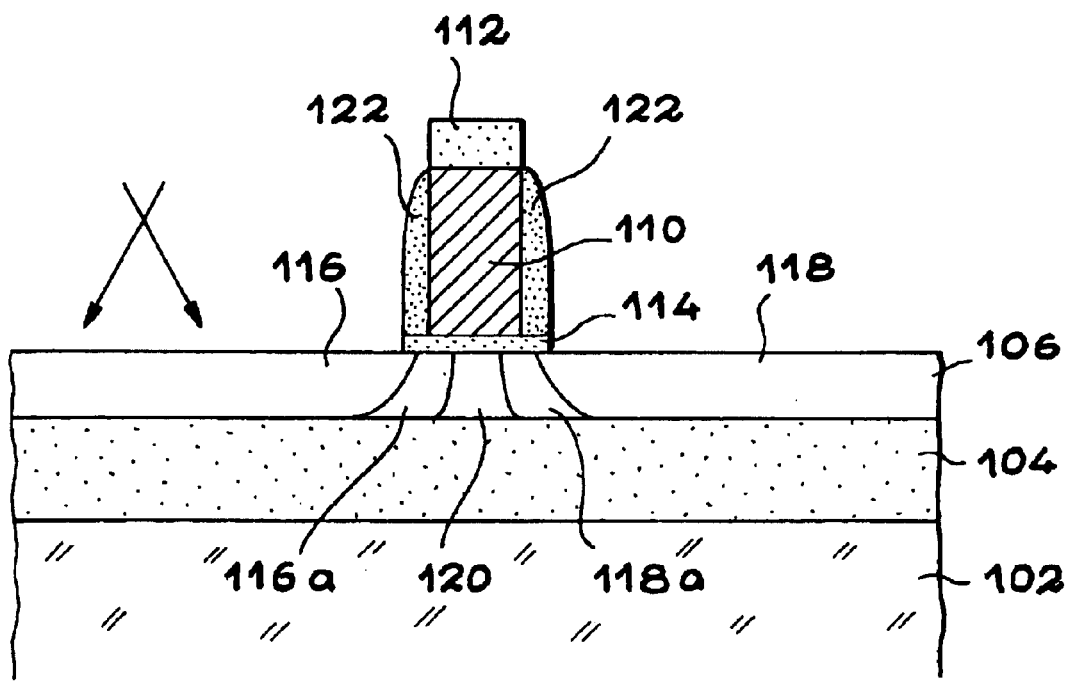

FIG. 5 shows a second implantation of impurities in the thin surface layer 106 of the substrate, using the entire grid structure 130 as the implantation mask. Therefore, the implantation mask is wider than that used previously.

As with the first implantation, the second implantation is preferably made with a sufficient energy and dose rate to affect the entire thickness of the surface layer.

The second implantation forms the second doped regions 126, 128 in the thin layer that extend partially under the grid structure, and in fact under spacers 122. Once again, as symbolically shown by the arrows, the implantation may take place at a slight angle (from the normal to the substrate).

The parts of the first doped regions 116, 118 not affected by the second doping are marked 116a and 118a respectively.

For example, the implantation may be a boron implantation with a high dose rate of $10^{14}$ to $10^{16}$ at/cm$^2$ to form p$^+$ type regions 126, 128. It may be replaced or reinforced by a germanium or carbon implantation to form SiGe or SiC type regions 126, 128. Conventionally, the implantation is followed by annealing.

The type of doping agents used in the second implantation is unrelated to the type used in the first implantation.

The purpose of the second implantation is essentially to obtain a material that could be etched selectively with respect to the doped regions 116a, 118a not affected by the second implantation.

Figure 6:
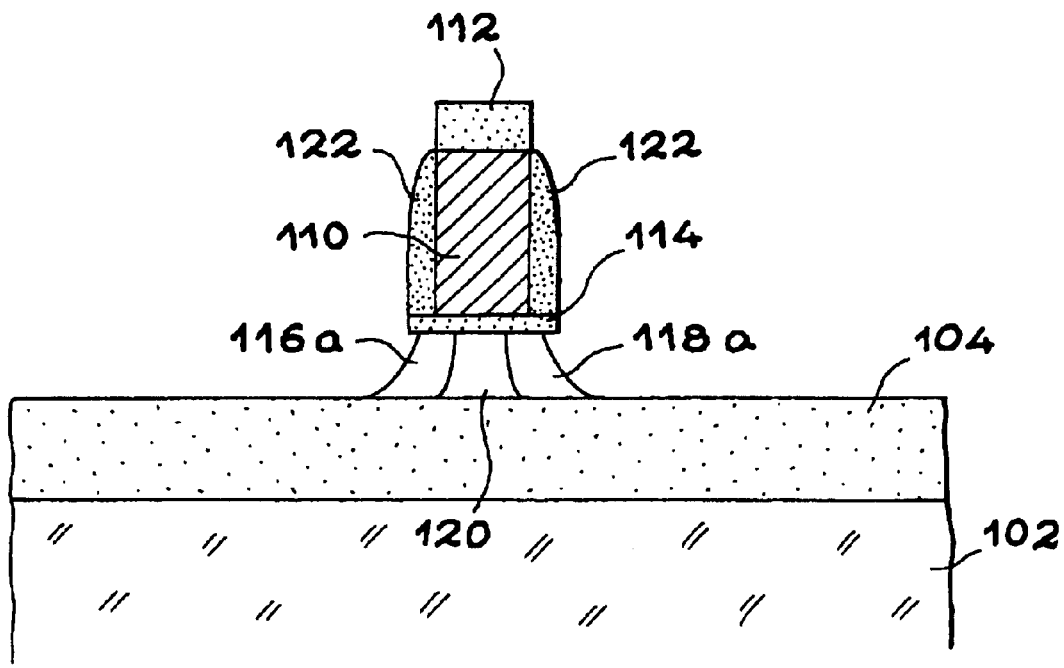

FIG. 6 shows the result of a selective isotropic chemical etching applied to eliminate the second implanted regions 126, 128. Etching is selective with respect to the SiO$_2$ buried layer 104, with respect to the grid insulation and the spacers (SiO$_2$ or Si$_3$N$_4$) and with respect to the doped regions 116a, 118a preserved from the implantation.

For these regions, the etching selectivity may be Si (p$^+$) with respect to Si(n) or Si(p), or SiGe, SiC with respect to Si.

The doped regions 116a, 118a, that are only doped once, form the source and drain extension regions and are denoted as such in the remainder of the text.

Figure 7:
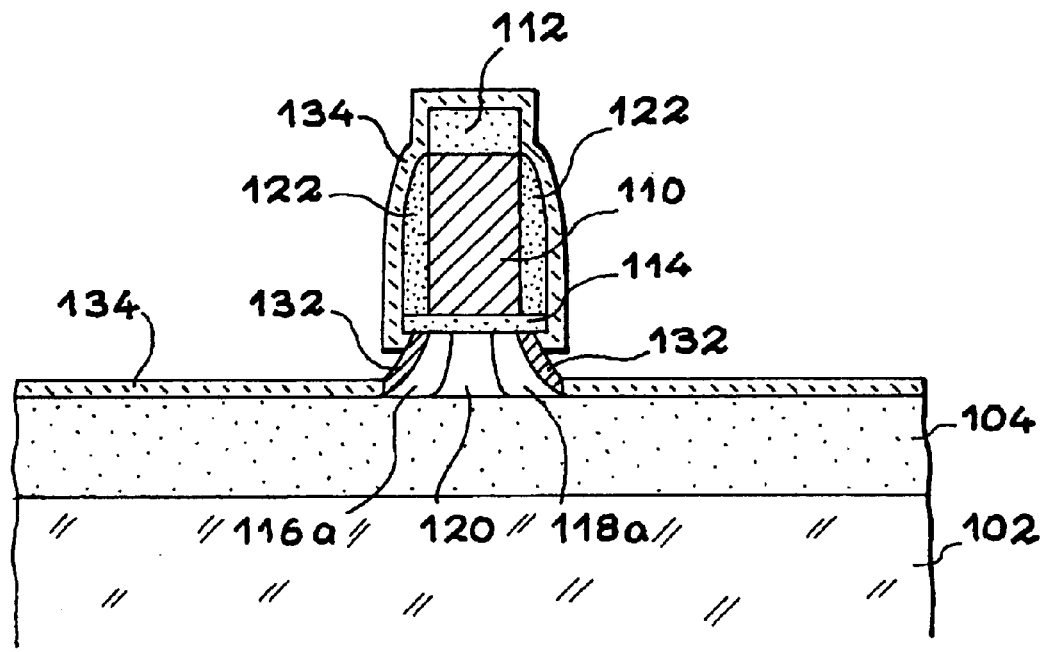

FIG. 7 shows the formation of a metal silicide contact layer 132 on the free sides of the source and drain extension regions. It also shows the formation of a metallic bond layer 134 on the remainder of the structure, in other words on the grid structure and on the buried silicon oxide layer 104, exposed by etching. For example, the contact and bond layers may be made of titanium silicide $TiSi_2$ and titanium nitride TiN.

The metallic bond layer may be fully or partially nitrided to prevent oxidation. It is preferably deposited under a nitrogen atmosphere.

The bond layer 134 and the contact layer 132 may be formed by a metal deposition followed by annealing.

Figure 8:
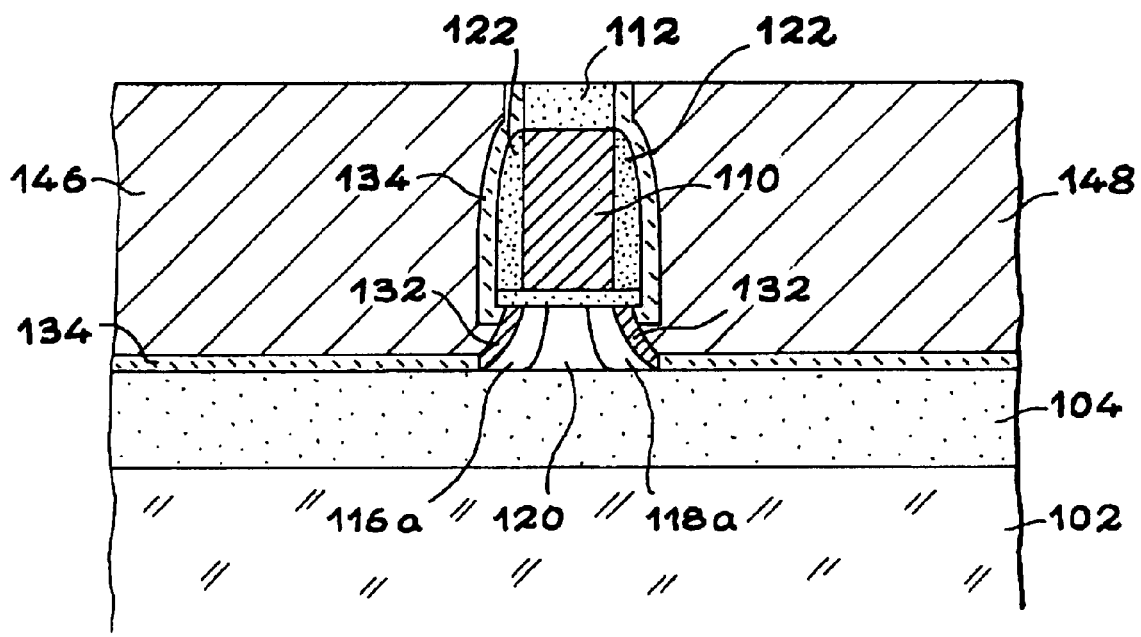

FIG. 8 shows the formation of a source 146 and a drain 148 made of a metal such as tungsten (W).

The metal is deposited using a conform chemical vapour deposition (CVD) technique and is then made plane to make it flush with the top of the grid structure.

Planing, for example done by mechanical-chemical polishing, is stopped on the insulating layer 112 (used as a stop layer).

It may possibly be followed by an etching operation, not visible in the plane of the figures, to separate and shape the metal in the source and drain regions away from the zone comprising the transistor.

In the zone of the transistor, the source and drain regions are separated and isolated by the grid structure, by the channel 120 and by the insulating layer 112.

FIG. 8 shows that the metal in the source and the drain is in contact with source and drain extension regions through contact layers 132, and therefore partially extends under the grid structure.

This type of construction considerably reduces the channel access resistance. The resistance of a material depends in particular on the number of carriers (electrons) present per unit volume. Even if highly doped, the number of conducting electrons in semiconductors is less than $10^{21}$ cm$^{-3}$, while it is more than $10^{22}$ cm$^{-3}$ for metals.

Furthermore, for the transistor conform with the invention, there is no insulation separating the source and drain extension regions from the metal in the source and drain.

FIGS. 9 to 13 described below show another possible embodiment of a transistor according to the invention. Operation steps in making parts identical to parts in the previous figures are not described in detail. Refer to the above text for further information.

Figure 9:
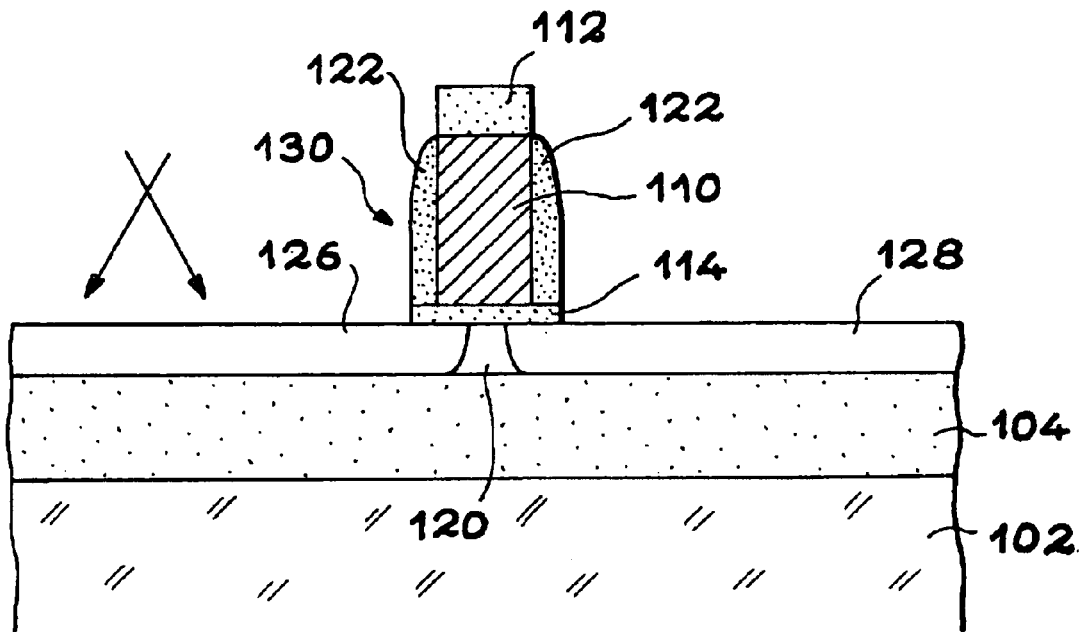
FIGS. 9 to 13 are diagrammatic cross sections of an SOI type substrate on which a transistor conform with the invention is made. They illustrate the successive steps in a process for manufacturing the transistor forming a variant of the process in FIGS. 4 to 8.

As shown in FIG. 9, an implantation of impurities marked by arrows is made using the grid structure 130 as a mask. This implantation is not done to control the doping state of source or drain extension regions, if there are any. In the same way as for the second implantation described with reference to FIG. 5, in this case impurities are implanted at a high dose rate to define doped regions sensitive to selective etching. For example, the doping done may be germanium, or carbon, or boron doping, and it may be followed by a heat treatment.

By analogy with FIG. 5, the doped regions are marked as references 126, 128.

An implantation at an angle, with rotation of the substrate, is used to form regions 126, 128 which extend partly under the grid structure, or even under the grid 122 itself.

A thin region of the surface layer 106 of the substrate located under the grid is preserved from the implantation and separates the doped regions 126, 128. This is the channel region 120.

Figure 10:
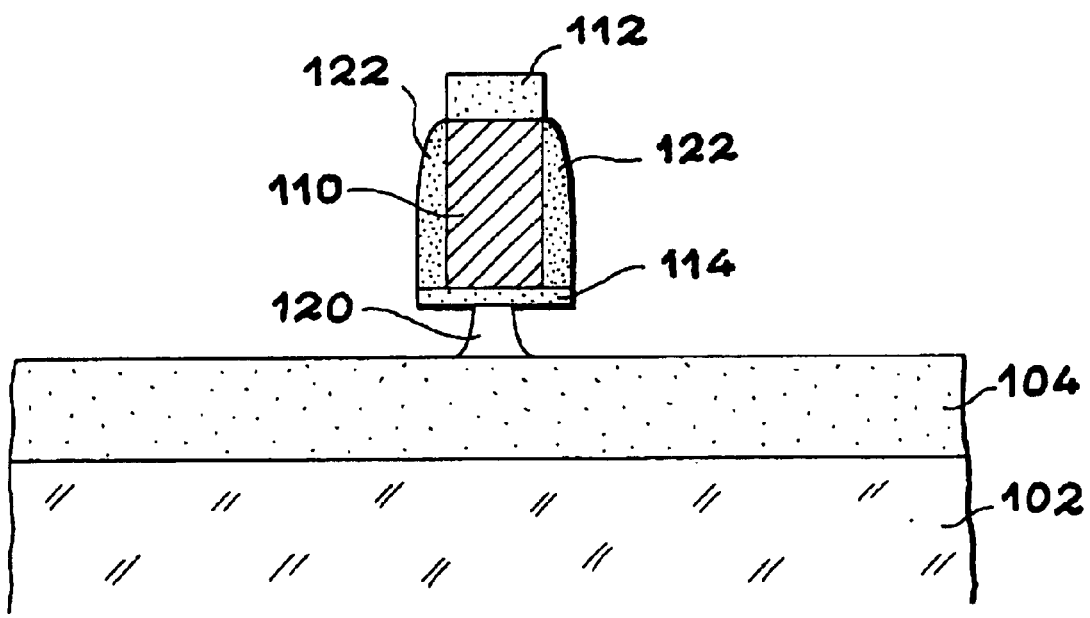

FIG. 10 shows the result of a selective etching of the doped regions. Etching of the doped material Si(p$^+$), SiGe or SiC is selective with respect to the semiconducting material in the channel, which is slightly n or p doped (or even intrinsic). It is also selective with respect to the silicon oxide in the buried layer and with respect to the materials surrounding the grid.

It will be observed that the grid structure is held in place by the channel region 120 alone, in which the sides are exposed by etching.

Figure 11:
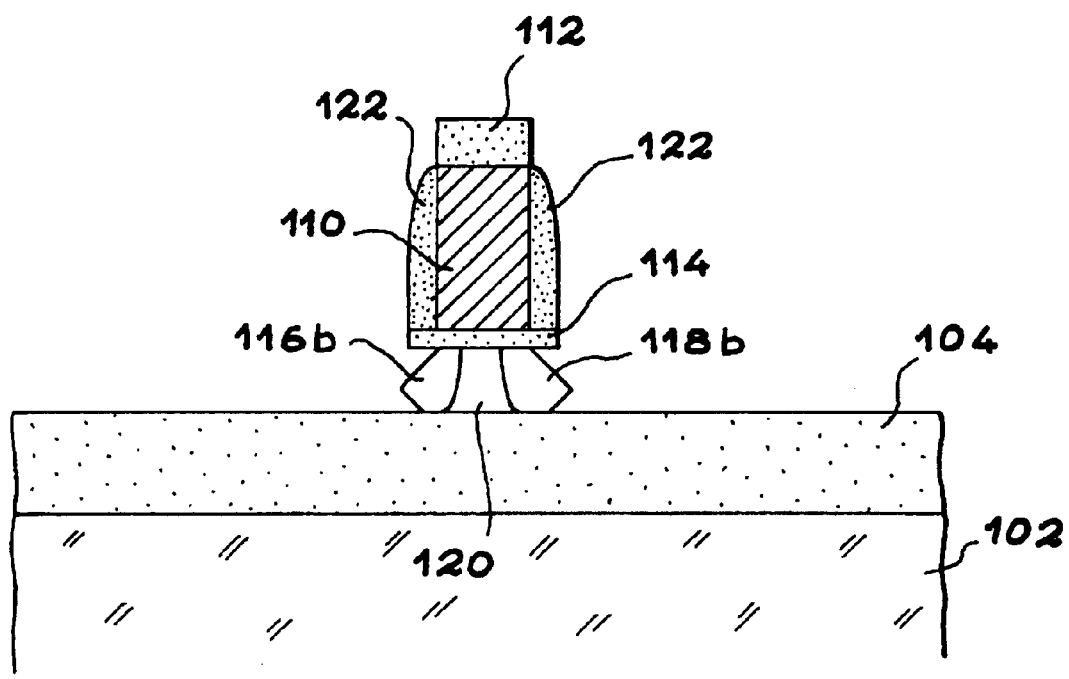

FIG. 11 shows the formation of source and drain extension regions on the channel. These regions are formed by selective growth, for example such as epitaxy.

The material used may be a metal, a semiconductor or a compound, for example such as $SiGe_xC_y$.

The material is chosen to guarantee selective growth and to set up a rectifier contact with the material in the channel (Schottky contact).

In the example illustrated, the material in the buried layer 104, the grid insulation 114 and the lateral spacers 122 are made from silicon oxide. Thus, a silicon epitaxy naturally causes selective growth of the extension regions 116b, 118b on the channel (made of silicon).

When the channel is doped in advance with type p doping, the n$^+$ type silicon is grown preferentially. On an n type channel, p$^+$ type silicon is grown preferentially.

When the material used for the source and drain extension regions is a metal, it is possible for example to use platinum or ruthenium oxide or iridium oxide for an n type channel (MOS transistor with p channel), or niobium, aluminium, molybdenum or titanium for a p type channel (MOS transistor with n channel).

The formation of facets on the source and drain extension regions is a phenomenon related to material growth.

Figure 12:
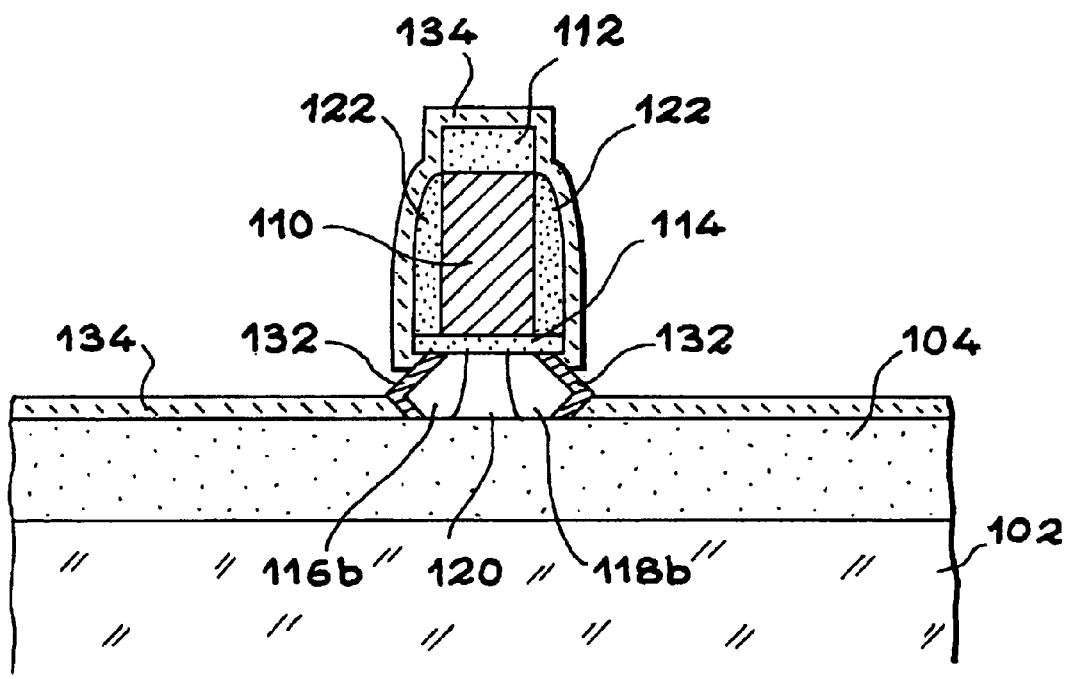

FIG. 12 shows the formation of a contact layer (metal silicide) 132 on the source and drain extension regions and the formation of a metallic bond layer on the grid structure and exposed parts of the buried layer 104. The contact layer may be of type $MSi_2$ or $M/MSi_2$ where M is a metal such as titanium, cobalt or nickel.

Figure 13:
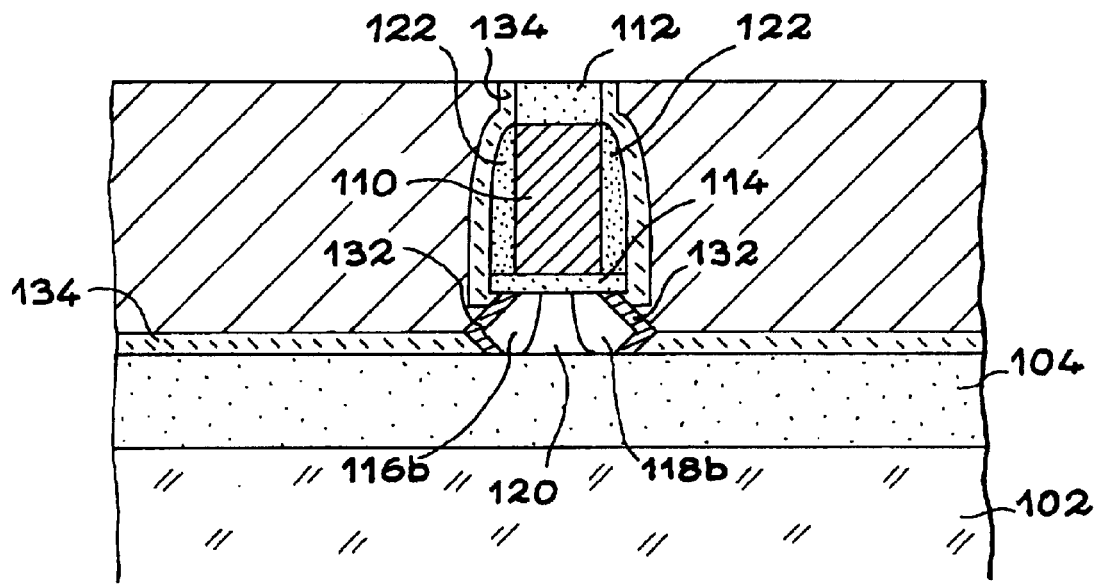

FIG. 13 shows the formation of source and drain regions 146, 148, by deposition, planing and etching of a metal. The description related to FIG. 8 provides further information about this subject.

When the source and drain extension regions 116b and 118b are made of a metal, the source and drain metal may be deposited directly in contact with these regions without firstly forming a silicide layer. However, it is possible to provide an additional bond metal.

The above description of the figures is particularly applicable to MOS transistors made on silicon on insulator (SOI) type substrates. However, the transistors may also be made on a solid substrate such as a silicon substrate or other III–V semiconductors provided that a thin layer transfer technique is used (for example SMART-CUT).

Figure 14:
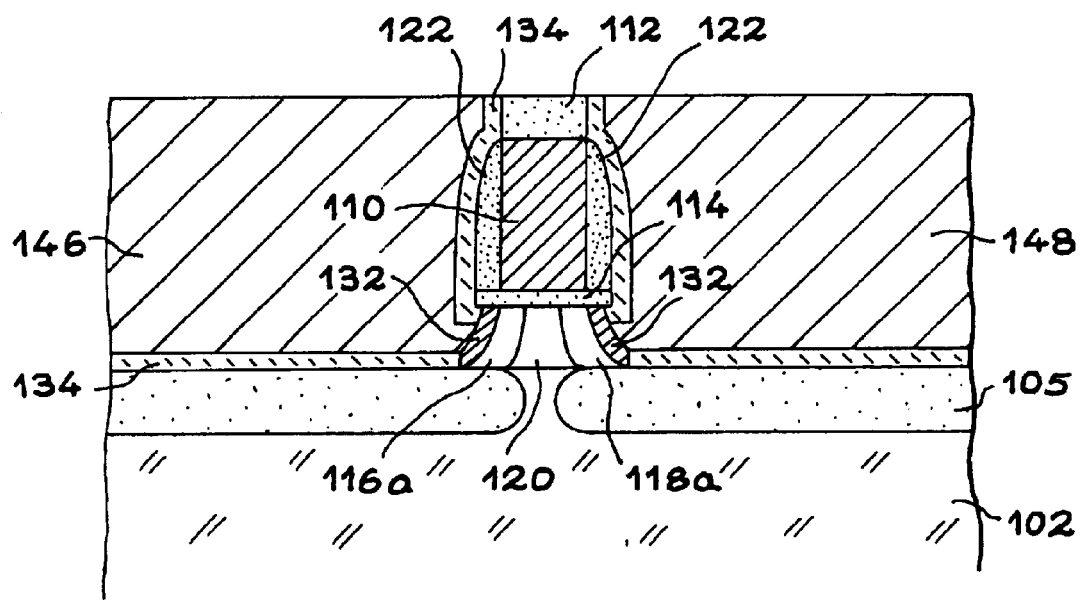
FIG. 14 is a diagrammatic cross section of a transistor conform with the invention made on a solid semiconducting substrate.
Figure 15:
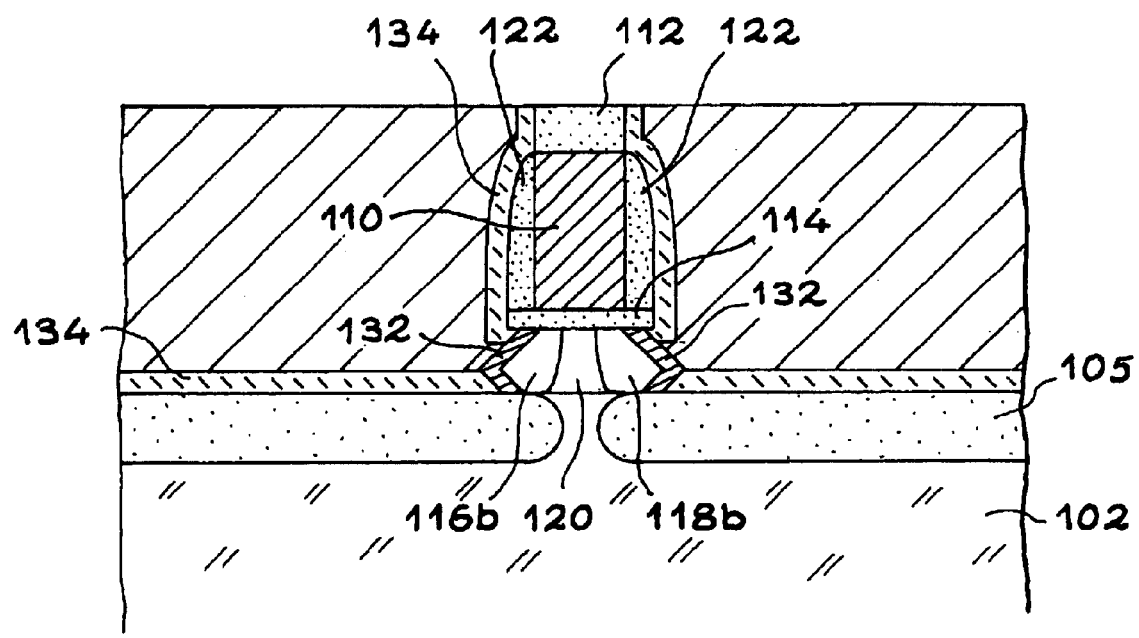
FIG. 15 is a diagrammatic cross section of a transistor conform with the invention, made on a solid semiconducting substrate and forming a variant to the transistor in FIG. 14.

FIGS. 14 and 15 show transistors obtained using processes described above on a solid silicon substrate, respectively. Therefore, the above description is applicable.

It is observed that a layer of silicon oxide 105 is located under the source and drain and extends approximately as far as channel 120.

Unlike the buried layer of silicon oxide 104 visible in the previous figures, the oxide layer 105 does not exist before the transistor is formed.

The oxide layer 105 may be formed by buried selective oxidation; further information is given on this subject in the description of the document (1) mentioned above.

When the oxide layer is obtained by oxidation, the grid structure may be used as an implantation mask. In this case which is illustrated by the figures, the channel region 120 is not separated from the solid part of the substrate and is protected by a silicon nitride layer. This type of structure evacuates parasite charges generated close to the insulating grid/drain interface.

If there is no buried oxide layer when etching takes place, the depth of the etching may be controlled by acting on the implantation depth of doping impurities during the definition of doped zones to be selectively eliminated.

FIG. 14 shows a rounded shape of the sides of source and drain extension regions 116a, 118a that shows that these regions were defined by selective and isotropic etching, in other words according to a first possible embodiment of the process according to the invention.

However in FIG. 15, the facets of the source and drain extension regions 116b and 118b are a sign of formation by selective growth.

Figure 16:
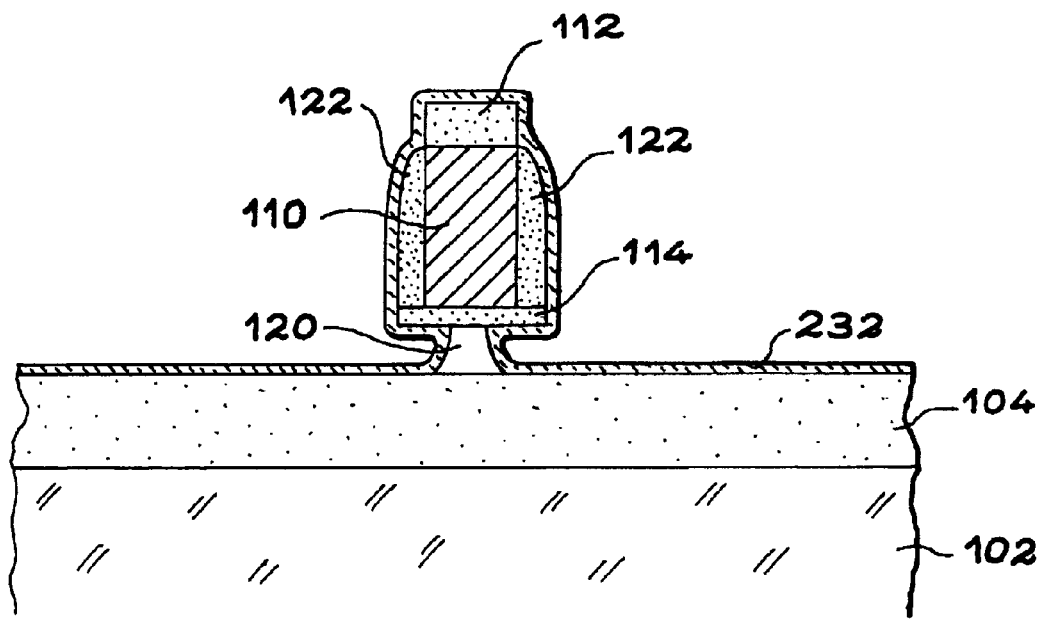
FIGS. 16 to 18 are diagrammatic cross sections illustrating another variant of the process for making a transistor conform with the invention on a silicon on insulator type substrate.
Figure 17:
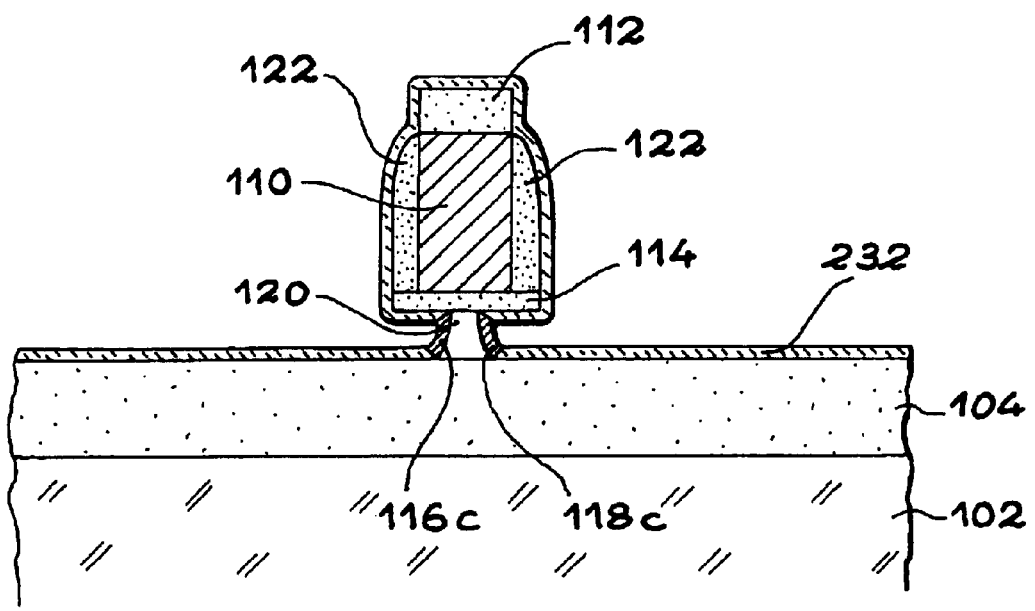
Figure 18:
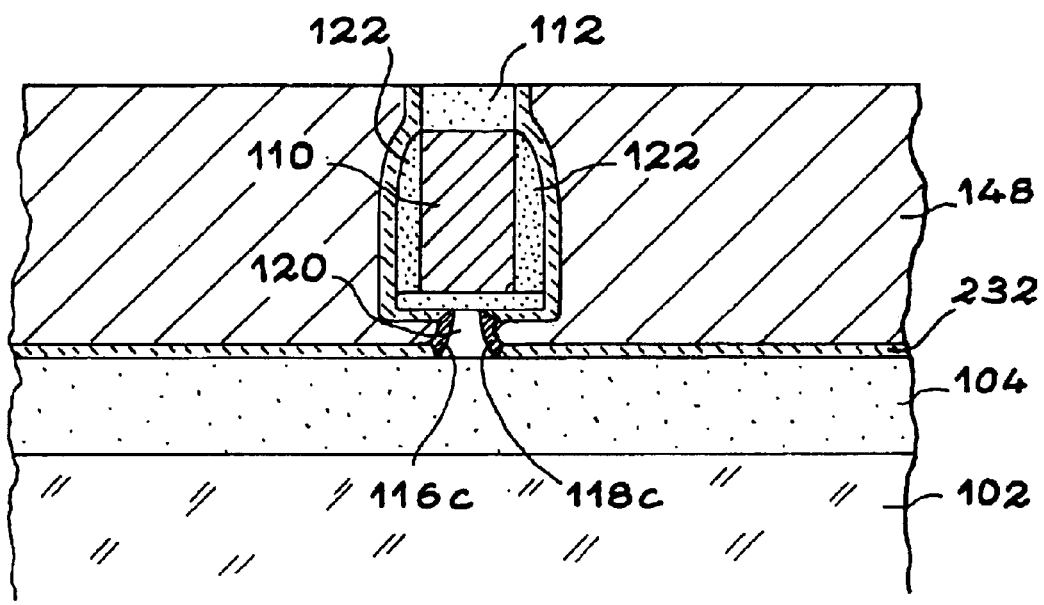

We will now describe another variant of the process for making a transistor conform with the invention, with reference to FIGS. 16, 17 and 18. According to this other variant, the source and drain extension regions are formed by silicide zones formed directly on the sides of the channel.

The first steps in the process are approximately the same as the steps used to obtain the structure already described with reference to FIGS. 9 and 10. Consequently, these steps are not repeated here. As shown in FIG. 16, a metal layer 232 is deposited that covers the sides of the channel region, previously exposed by etching. The metal layer 232 also covers the grid structure 130 and the buried oxide layer 104 also exposed by etching.

The metal is chosen to enable selective silicidation with the silicon in the channel region 120 in order to form silicided source and drain extension regions. Furthermore, the metal is selected to form extension regions forming Schottky rectifier contacts.

For example, the metal for PMOS transistors with a p type channel can be selected from among platinum, iridium or ruthenium oxide.

The metal for NMOS transistors with an n type channel may be chosen, for example, from among niobium, aluminium, titanium and erbium.

FIG. 17 shows a selective silicidation step during which the structure is subject to heat treatment with a sufficient heat budget to cause partial interdiffusion of the metal deposited with the silicon in the channel 120.

This heat treatment results in source and drain extension regions 116c, 118c in the form of silicided zones that extend partly in the channel region as initially defined by etching.

It is also observed that the source and drain extension regions 116c, 118c extend at least partly under the grid 110.

The part of the metal layer 232 extending beyond the sides of the channel zone is not subject to silicidation if it is not in contact with silicon. In these regions, depending on the metal selected, the metal may either remain unchanged during the heat treatment, or for example it may be nitrided. For example, this is the case when the metal is titanium and the heat treatment takes place under a nitrogen atmosphere.

Titanium, in contact with the nitrogen atmosphere, is subject to surface nitridation. Nitridation takes place outside the part of the titanium layer that covers the sides of the channel, and also on this part.

The nitrated metal part, or more generally the part of the metal that does not participate in silicidation, in other words in the formation of source and drain extension regions, may form a bond layer for the source and drain regions made later.

Furthermore, another additional bond layer may be formed on the structure after the heat treatment. This layer is not shown in the figure for simplification reasons.

FIG. 18 shows the formation of the source and drain 146 and 148 by deposition and planing of a metal.

Further information on this subject is given in the above description, for example with respect to FIGS. 8 and 13.

Planing takes place stopping on the insulating layer 112 such that the part of the metal layer 232 above this insulating layer is eliminated. This electrically isolates the source and the drain.

The production of source and drain extension regions in the form of silicided zones is not limited to the case in which the transistor is made on a silicon on insulator type substrate. It may also be envisaged for a transistor made on a solid substrate.

Figure 19:
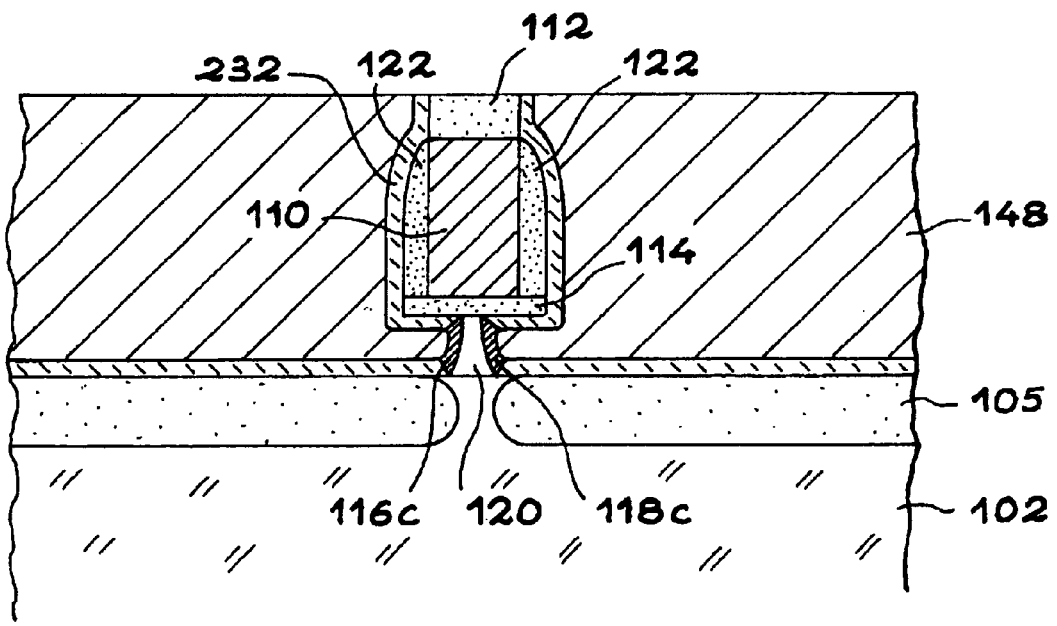
FIG. 19 is a diagrammatic cross section illustrating manufacturing of the transistor in FIG. 18 on a solid substrate.

FIG. 19 shows this type of embodiment. It is observed that source and drain extension regions 116c, 118c are also partly located under the grid 120. Furthermore, there is a passage between the channel 120 between the regions 116c, 118c and the solid part of the substrate 102. The passage extends between two parts of the oxide layer 105 located under the source and drain, respectively. For other elements of the figure, refer to the above description.

As mentioned in the above description, the thin surface layer or the part of the substrate in which the transistor channel is formed may advantageously be etched selectively between regions with different doping concentrations. The part of the material to be etched is then defined, for example, by an implantation of impurities with a high dose rate. Further information on this subject is given in the description with reference to FIGS. 5 and 6 and FIGS. 9 and 10.

In the example in these figures, the implantation is done with a fairly low energy such that the concentration of impurities is maximum close to the surface. As shown in FIGS. 6 and 10, the result is that the grid insulation layer is partly exposed during etching on the face facing the substrate.

On the other hand, when the implantation is done with a higher energy, the maximum concentration of impurities is deeper and the semiconducting material can be preserved over a larger part of the face of the grid insulation layer facing the substrate.

Figure 20:
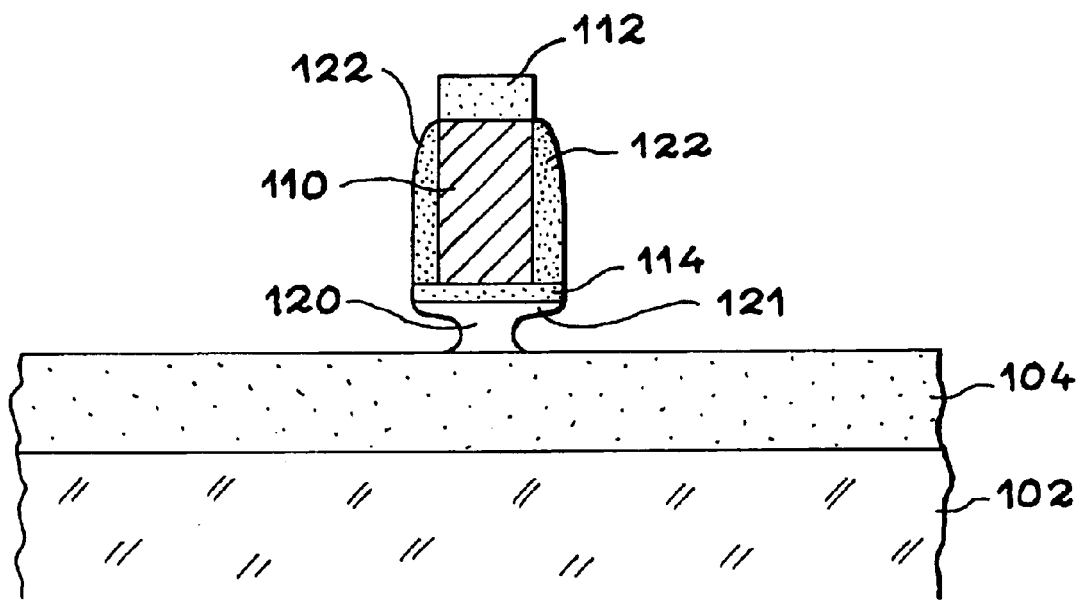
FIG. 20 is a diagrammatic cross section illustrating an etching operation under the grid during a step in the manufacturing of a transistor conform with the invention forming a variant from that shown in FIG. 10.

Thus, after etching, a structure like that shown in FIG. 20 is obtained. By comparing this structure with the structure in FIG. 10, it is observed that the channel region now shows a cornice 121 that extends under the entire grid insulating layer.

Figure 21:
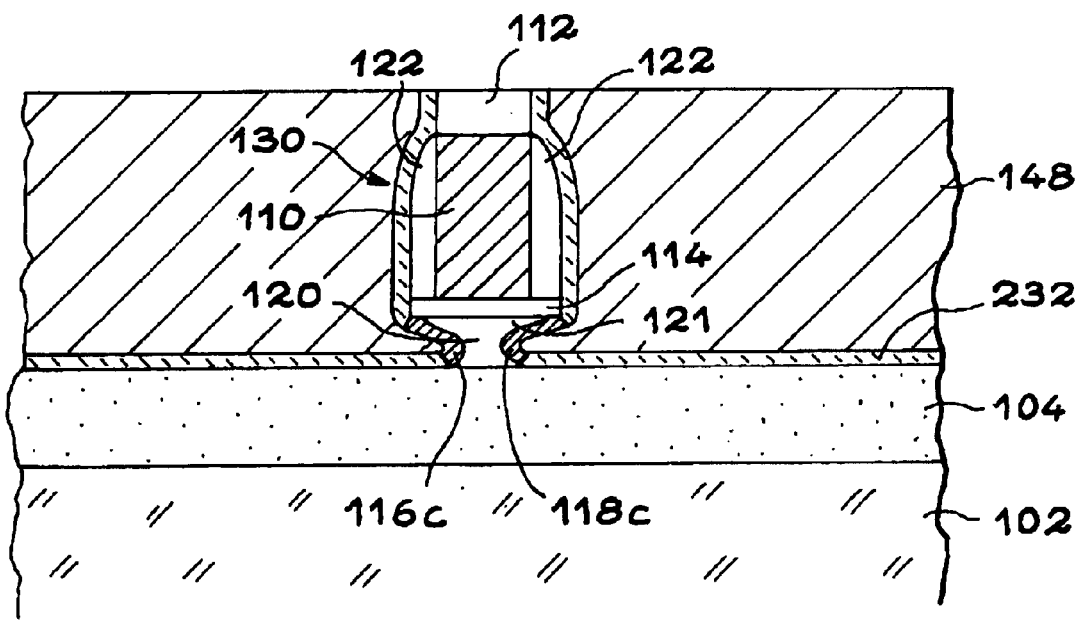
FIGS. 21 and 22 show a diagrammatic section of two possible embodiments of a transistor conform with the invention starting from the structure in FIG. 20.

FIG. 21 shows a transistor made starting from the structure in FIG. 20 and in which the source and drain extension regions are formed by silicidation. The silicidation process is the same as that described with reference to FIGS. 16 and 17.

It is observed that the source and drain extension regions formed by partial inter-diffusion of the metal in the metal layer 232 with silicon in the channel region 120 extend onto the part of the cornice that is fully or almost fully silicided. Therefore, they extend from underneath the grid 110 as far as the edge of the grid structure 130. Due to the resulting particular shape of the source and drain extension regions, the access resistance to the channel is further improved and the frequency performances of the transistor are even better.

Figure 22:
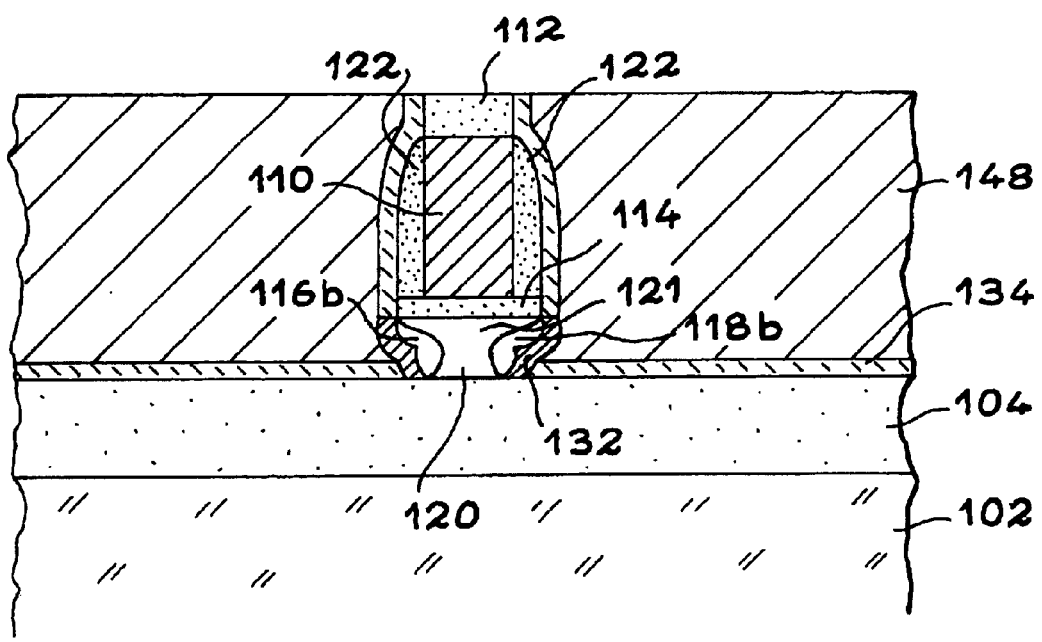

FIG. 22 shows another transistor, also made starting from the structure in FIG. 20 and in which the source and drain extension regions 116b, 118b are formed by material growth. The process for formation of the extension by growth, in itself, is the same as was described with reference to FIG. 11. It is observed that the channel region still comprises a cornice 121 on which the material used in the source and drain extension regions is also free to grow.

References 132, 134 denote a silicide layer formed on the source and drain extension regions 116b, 118b, and a bond layer formed on the rest of the structure, respectively. However, it should be specified that the silicide layer 132 in FIG. 22 is not the same as the silicide formed on the channel according to FIG. 21. In FIG. 22, the silicide layer 132 simply covers the source and drain extension regions 116b, 118b while in FIG. 21, the silicide forms the source and drain extension regions 116c, 118c.

Figure 23:
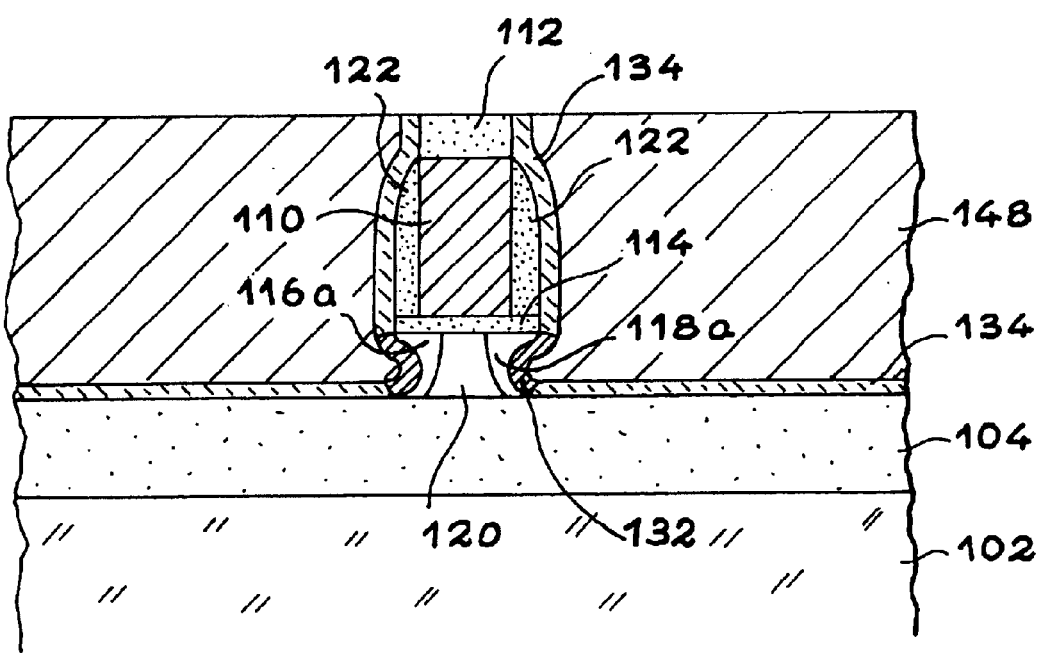
FIG. 23 illustrates a diagrammatic section of another possible embodiment of a transistor conform with the invention, in which the source and drain extension regions are defined by etching.

FIG. 23 shows yet an other transistor in which the source and drain extension regions 116a, 118a are defined while etching the substrate according to the process described with references to FIGS. 5 and 6.

However, the implantation of doping impurities defining the zone to be eliminated during etching, as for the applications illustrated in FIGS. 20 to 22, is done with sufficient depth to protect a "cornice" 117 under the grid insulation 114.

In FIG. 23, it can be seen that the "cornice" 117 is now formed in the source and drain extension regions 116a, 118a, and not in the channel region.

References 132 and 134 still denote a silicide layer formed on the source and drain extension regions, and a bond layer, like the structure described with reference to FIG. 7.

The manufacturing processes illustrated by FIGS. 20 to 23 apply to transistors formed on a silicon on insulator type substrate.

However, it is still possible to adapt these processes to transistors made on a solid substrate. Further information about this subject is given on the previous FIGS. 14, 15 and 19, and the related description.

Documents Mentioned (1)

FR-2 749 977 date Sep. 10, 1998

(2)

"Extremely high selective etching of porous Si for single etch-step band-and-etch-back SOI"
K. Sakaguchi et al., Extended abstracts of the 1994 International Conference on solid state devices and materials, Yokohawa, 1994, p. 259–261.

What is claimed is:

1. Field effect transistor, comprising:
    a channel re ion (120) made of a semiconducting material above which there is a sate structure (130), the gate structure comprising a gate electrode (110) and insulating spacers (122) coating the sides of the gate; electrode
    regions, called the source and drain extension regions (116a, 116b, 118a, 118b, 116c, 118c), located on each side of the channel in direct contact with the se conducting material of the channel, and extending at least partly under the gate electrode, the extension re ions being made of a non-insulating material,
    metallic source and drain electrodes (146, 148), in contact with the source and drain extension regions respectively, and extending at least partly under the gate structure.

2. Transistor according to claim 1, in which the source and drain electrodes are in contact with the source and drain extension regions, through associated metal silicide layers (132).

3. Transistor according to claim 1, comprising an insulating layer (104) to electrically isolate the transistor from a solid part (102) of a support substrate (100).

4. Transistor according to claim 1, comprising a discontinuous insulation layer (105) separating an assembly formed by the source and drain electrodes and the source and drain extension regions from a solid part (102) of a substrate supporting the transistor, the channel (120) being in electrical contact with the said solid part.

* * * * *